(12) United States Patent
Bonart et al.

(10) Patent No.: US 9,698,107 B2
(45) Date of Patent: Jul. 4, 2017

(54) SEMICONDUCTOR DEVICE AND METHOD OF MANUFACTURING A SEMICONDUCTOR DEVICE

(71) Applicants: Infineon Technologies AG, Neubiberg (DE); Robert Bosch GmbH, Stuttgart-Feuerbach (DE)

(72) Inventors: Dietrich Bonart, Bad Abbach (DE); Alfred Goerlach, Kusterdingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/953,302

(22) Filed: Nov. 28, 2015

(65) Prior Publication Data

US 2016/0155677 A1 Jun. 2, 2016

(30) Foreign Application Priority Data

Dec. 2, 2014 (DE) .................. 10 2014 117 723

(51) Int. Cl.
*H01L 23/24* (2006.01)
*H01L 23/58* (2006.01)
*H01L 23/051* (2006.01)
*H01L 21/66* (2006.01)
(Continued)

(52) U.S. Cl.
CPC ............ *H01L 23/585* (2013.01); *H01L 22/34* (2013.01); *H01L 23/051* (2013.01); *H01L 23/24* (2013.01); *H01L 24/29* (2013.01); *H01L 23/5228* (2013.01); *H01L 24/32* (2013.01); *H01L 24/33* (2013.01); *H01L 24/83* (2013.01); *H01L 2224/291* (2013.01); *H01L 2224/29017* (2013.01); *H01L 2224/32245* (2013.01); *H01L 2224/33181* (2013.01); *H01L 2224/83101* (2013.01); *H01L 2224/83424* (2013.01); *H01L 2224/83447* (2013.01); *H01L 2924/10253* (2013.01); *H01L 2924/1203* (2013.01); *H01L 2924/1205* (2013.01);
(Continued)

(58) Field of Classification Search
CPC ... H01L 21/1768; H01L 22/32; H01L 23/051; H01L 23/24; H01L 23/585; H01L 24/29; H01L 22/34
See application file for complete search history.

(56) References Cited

U.S. PATENT DOCUMENTS

| 6,046,433 A | 4/2000 | Gross et al. |
| 6,094,144 A | 7/2000 | Dishongh et al. |

(Continued)

FOREIGN PATENT DOCUMENTS

DE 102012100429 A 8/2012

*Primary Examiner* — Fazli Erdem

(57) ABSTRACT

Various embodiments provide a semiconductor device, wherein the semiconductor device comprises a semiconductor device chip formed at a substrate, wherein the semiconductor device chip comprises an active region formed in a center of the substrate and a boundary region free of active components of the semiconductor device chip; and a detection wiring arranged in the boundary region of the substrate and at least partially surrounding the active region, wherein the detection wiring and the semiconductor device chip are electrically isolated from each other; and wherein the detection wiring and the substrate are electrically connected with each other via a connection having a high electrical resistance.

14 Claims, 4 Drawing Sheets

(51) Int. Cl.
*H01L 23/00* (2006.01)
*H01L 23/522* (2006.01)

(52) U.S. Cl.
CPC ............ *H01L 2924/1304* (2013.01); *H01L 2924/13055* (2013.01); *H01L 2924/13091* (2013.01)

(56) References Cited

U.S. PATENT DOCUMENTS

| | | | |
|---|---|---|---|
| 6,452,502 B1* | 9/2002 | Dishongh | G01R 31/2856 228/104 |
| 7,196,294 B2 | 3/2007 | Hofmeister et al. | |
| 7,948,249 B2 | 5/2011 | Park | |
| 8,350,378 B2 | 1/2013 | Spitz et al. | |
| 2008/0012045 A1* | 1/2008 | Muto | H01L 21/565 257/177 |
| 2012/0032167 A1* | 2/2012 | Low | H01L 22/34 257/48 |
| 2016/0091557 A1* | 3/2016 | Okouchi | G01R 31/2805 324/750.3 |

* cited by examiner

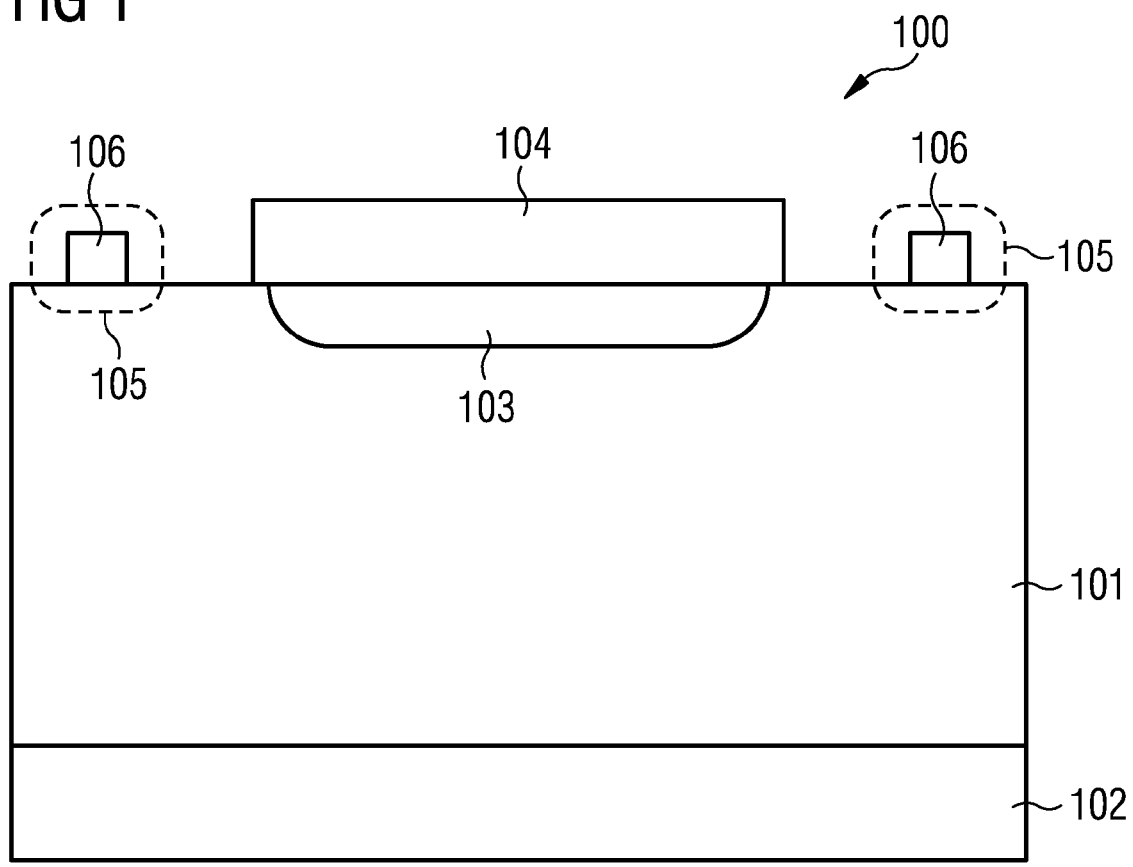

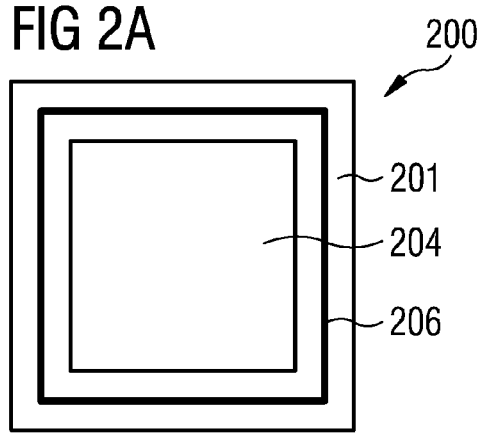
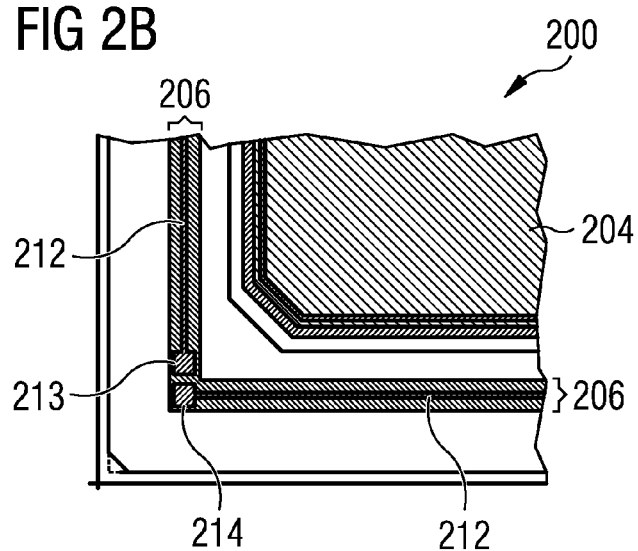
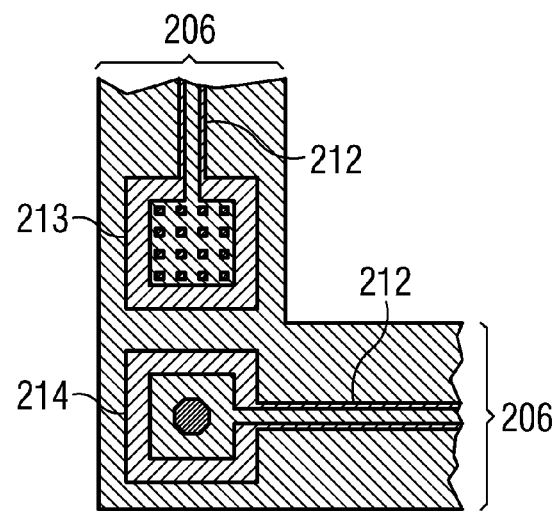

SEMICONDUCTOR DEVICE AND METHOD OF MANUFACTURING A SEMICONDUCTOR DEVICE

TECHNICAL FIELD

Various embodiments relate to a semiconductor device, in particular a switching element, a semiconductor device arrangement, and a method of manufacturing the semiconductor device.

BACKGROUND

In the field of semiconductor devices or manufacturing semiconductor components, e.g. so called press-fit power diodes, it is known to use solder layers to electrically connect a semiconductor chip or die.

For example, from U.S. Pat. No. 8,350,378 B2 A diode, e.g., a press-fit power diode for a rectifier in a motor vehicle, is known which includes a semiconductor chip which is connected to a head wire and a base via solder layers. A plastic sheathing, which is situated at least in the chip area and includes a plastic sleeve, enables a hard casting compound to be used and establishes a mechanical connection between the base and the head wire and forms a housing together with the base. An undercut, which extends into the casting compound, and a gap between the sleeve and the edge of the base achieve a compact design. Bevels provided on both sides enable the diode to be pressed into the rectifier from two sides.

SUMMARY

Various embodiments provide a semiconductor device, wherein the semiconductor device comprises a semiconductor device chip formed at a substrate, wherein the semiconductor device chip comprises an active region formed in a center of the substrate and a boundary region free of active components of the semiconductor device chip; and a detection wiring arranged in the boundary region of the substrate and at least partially surrounding the active region, wherein the detection wiring and the semiconductor device chip are electrically isolated from each other; and wherein the detection wiring and the substrate are electrically connected with each other via a connection path having a high electrical resistance.

Furthermore, various embodiments provide a semiconductor device arrangement, wherein the arrangement comprises a semiconductor device, and a carrier comprising a base, wherein the semiconductor device is attached to the base of the carrier by a solder layer.

Moreover, various embodiments provide a method of manufacturing a semiconductor device, wherein the method comprises forming a semiconductor device at a center region of a substrate; and forming a detection wiring surrounding at least a portion of the central region of the substrate, by depositing an electrically conductive trace on the substrate in a boundary region surrounding the center region, wherein the detection wiring and the semiconductor device chip are electrically isolated from each other; and wherein the detection wiring and the substrate are electrically connected with each other via a connection path having a high electrical resistance.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIG. 1 schematically illustrates a cross sectional view of a semiconductor device according to an exemplary embodiment;

FIGS. 2A to 2C schematically illustrate top views of a semiconductor device according to an exemplary embodiment;

DETAILED DESCRIPTION

Figure 3A:
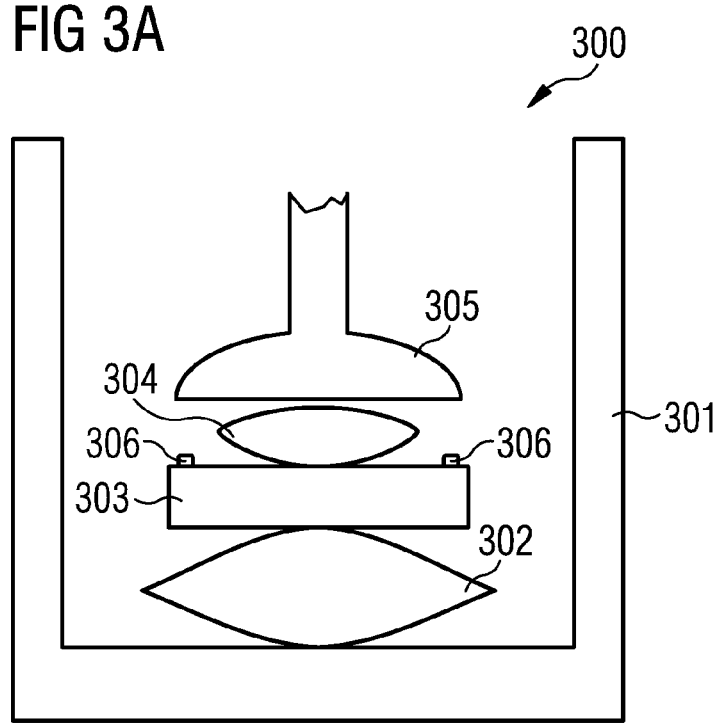
FIGS. 3A and 3B schematically illustrate views of a semiconductor device arrangement according to an exemplary embodiment.

In the following further exemplary embodiments of a semiconductor device, a semiconductor device arrangement and a method of manufacturing a semiconductor device are described. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a semiconductor device. The semiconductor device comprises a diode chip arranged or formed in or on a center portion or region of a (semiconductor) substrate, wherein the center region forms an active region or portion of the semiconductor device. At least partially surrounding this center region, a bonding wiring is formed on the substrate in a boundary or peripheral region of the substrate. The detection wiring and the semiconductor device chip are electrically isolated from each other (or in other words no electrically conductive path is formed between the detection wiring and the semiconductor device chip or no metallization path is formed between these elements). Furthermore, the detection wiring and the substrate are electrically connected with each other via a connection having a high electrical resistance. The semiconductor device may be used in a semiconductor device arrangement.

In particular, the semiconductor device may be a switching element like a (power) diode or (power) transistor, e.g. a MOSFET or IGBT or any semiconductor circuit serving as a switching element. In some exemplary embodiments the (power) semiconductor device, e.g. switching element, may be configured for a press-fit connection. However, the semiconductor device may as well be a semiconductor device which is configured for other connection technologies, e.g. soldering, bonding or clip bonding processes. In general, by providing an additional detection wiring surrounding an active region of the semiconductor device it may be possible to detect solder in an easy and efficient way, which flows in regions in which it should not be present, e.g. overflows or spills out or a misplacing may be possible. Thus, the provision of the additional detection wiring may be advantageous for every structure comprising a semiconductor device in which overflown or spilled out solder should be detectable, e.g. for detecting a possible faulty condition in advance, i.e. in a testing phase before normal operation. The term "high electrical resistance" may particularly denote that a respective conductive path has an electrical resistance of at least 10 kΩ. In particular, this resistance value may be measured at the operation temperature (e.g. in a temperature range between 100° C. and 200° C.) of the respective device the conductive path forms a part of.

Such a semiconductor device arrangement may form a press-fit or bonded semiconductor device, for example. The semiconductor device arrangement may be tested by applying a test voltage (which is lower than the set operation voltage) to the semiconductor device and measuring a leakage current through the semiconductor device. In case the measured leakage voltage is above a given threshold, it is probable that (after soldering) some solder may extent too far into the boundary region and the respective semiconductor device arrangement or press-fit semiconductor device may be rejected as faulty.

In particular, the detection wiring is formed in the boundary region or periphery or circumferential region of the substrate. For example, the detection wiring may be formed by conductive metal paths and/or semiconductor paths formed on or in the substrate. In particular, the detection wiring or at least a portion of the detection wiring may be arranged on top of the substrate. Thus, it may be possible that a solder layer formed during manufacturing of the semiconductor device and/or fixing the semiconductor device chip on a carrier, e.g. into a sheathing or housing, may contact the detection wiring in an easy way so that a mismatch of the semiconductor device chip and/or the solder layer may be easily detected by a leakage current. In particular, the semiconductor device arrangement may be a press-fit semiconductor device arrangement, i.e. configured to be connected or contacted to a further component, e.g. a rectifier, by a press fit. The sheathing may form a cup-like structure comprising a cavity or recess in which the semiconductor device is placed. However, it should be noted that beside a press-fit connection alternatively a soldering, bonding or clip bonding connection may be used. In these cases alternatively not a sheathing may be used but a carrier preferably having a substantially planar surface.

Thus, by providing an additional detection wiring or detection wiring structure on the substrate of a semiconductor device it may be possible to enable a detection of a misplaced solder layer or solder plate used for electrically connecting or bonding the a semiconductor chip or die, e.g. a diode chip or transistor chip. For example, the substrate may be a semiconductor (e.g. silicon) substrate. In particular, such a detection wiring may be connected or is connected to a detection circuitry and can be used in a testing process or testing cycle to detect whether solder is arranged or present at positions far away from the center (where the diode is arranged) of the substrate, which may (e.g. due to an additional current path) corrupt or disturb the function of the semiconductor device during normal operation. Due to the provision of the additional detection wiring it may be possible to reduce a width or broadness of the boundary region. This boundary region is typically (in known semiconductor devices) quite broad in order to compensate for uncertainty of a placing of solder layers or solder plates used in manufacturing semiconductor device arrangements, e.g. power diode arrangements.

In the following exemplary embodiments of the semiconductor device are described. However, the features and elements described with respect to these embodiments can be combined with exemplary embodiments of the semiconductor device arrangement and the methods of manufacturing a semiconductor device.

According to an exemplary embodiment of the semiconductor device the detection wiring surrounds the active region formed in the center region of the substrate.

It should be noted that the term "surrounds the active region" may particularly denote that the active region is substantially completely surrounded or enclosed by the wiring. However, small gaps in the detection wiring may be present so that the enclosure is not complete. It should be noted that in particular, the surrounding or enclosure refers to a two dimensional enclosure, e.g. a lateral enclosure while no detection wiring may be arranged above and/or below the active region of the semiconductor device chip, e.g. (power) switching element chip, like power diode or power transistor. That is, the detection wiring may form a lateral or two-dimensional enclosure of the semiconductor device while the power upper and/or lower side of the semiconductor device may still be contactable or connectable. In other words, the detection wiring may form a ring or ring-like structure. By providing a detection wiring (substantially) surrounding or enclosing the whole active region of the semiconductor device it may be possible to completely check whether superfluous solder is present in areas or regions outside of the active region or center region of the substrate which may lead to malfunction of the semiconductor device during operation.

According to an exemplary embodiment of the semiconductor device the detection wiring comprises a material selected out of the group consisting of metal and semiconductor material. In particular, copper may be used at least for portions of the detection wiring, e.g. for the detection wiring trace or path arranged on the top of the substrate and completely surrounding the active region of the semiconductor device.

According to an exemplary embodiment of the semiconductor device the detection wiring is formed so that a leakage current flowing through the detection wiring is small compared to a diode leakage current at operation temperature of the semiconductor device.

In particular, the term "small" may denote in this context that the leakage current through the detection circuit is smaller than the diode leakage current by a factor of at least 10, in particular at least 50, preferably in the range of 100 to 1000. The ratio of the leakage currents may be in particular adjusted or set by modifying a width of the detection wiring, i.e. by modifying or adjusting an electrical resistance of the detection wiring or parts thereof. In particular, this may be a suitable way to adjust the resistance and thus the relative leakage current flowing through the detection wiring in case the detection wiring comprises traces or paths comprising or consisting of a semiconductor material, like poly-silicon. In particular, a material of the wiring circuit and/or a dimension, e.g. a width of the detection wiring or detection wiring path, may be selected to ensure a small leakage current flow.

According to an exemplary embodiment of the semiconductor device the detection wiring comprises a first electric conductive trace and a second electric conductive trace.

In particular, the first electric conductive trace or path is arranged on top of the substrate in the boundary region (and completely encircles the active region), while a second electric conductive trace or path may be arranged in the substrate in the boundary region. That is, the first conductive trace and the second conductive trace may be arranged above each other. However, according to some exemplary embodiments the two electric conductive traces may be arranged side by side or staggered to each other.

According to an exemplary embodiment of the semiconductor device a material of the second electric conductive trace has a lower temperature dependence of resistance than a temperature dependence of resistance of the semiconductor device.

By providing such a ratio of temperature dependence of this two elements of the semiconductor device it may be possible to ensure that at lower temperatures (e.g. about room temperature) at which a testing process may take place, the resistance of the second electric conductive trace is relatively low compared to the resistance of a main current path, e.g. through a junction of the semiconductor device (e.g. of a diode junction) while at a higher operation temperature the resistance of the main current path (e.g. diode junction) is much smaller than the one of the second electric conductive trace. Thus, it may be possible that at the operation temperature a possible leakage current through the detection wiring (i.e. the second electric conductive trace) is small compared to the current flowing through the semiconductor device.

It should be noted that the term "resistance of the semiconductor device" may particularly denote only the resistance formed by the active region of the semiconductor device, e.g. a p-n junction, and does not include the resistance caused by the detection wiring and/or detection circuitry. Thus, it may be possible that a total leakage current of a semiconductor device arrangement, the semiconductor device is used in, may be dominated by a potential leakage current through the detection wiring at low temperature, while at higher (i.e. operation temperature) the (leakage) current may be dominated by the (leakage) current through the semiconductor device.

In case that the main current path and the second electrically conductive trace is formed by a semiconductor (having typically negative temperature coefficients of resistance) this may in particular mean that the temperature coefficient of resistance of the second electrically conductive trace is higher (has a lower absolute value) than the main current path (having a lower value but a higher absolute value).

According to an exemplary embodiment of the semiconductor device the first electric conductive trace is arranged above the second electric conductive trace.

According to an exemplary embodiment of the semiconductor device the first electric conductive trace comprises a metal and the second electric conductive trace comprises poly-silicon.

In particular, the first electric conductive trace may comprise or consist of copper, silver, aluminum or any other suitable metal, while the second conductive trace comprises or consists of poly-silicon. The use of poly-silicon or another semiconductor material may be preferred in order to enable an efficient way to adjust or set the resistance of the respective trace, e.g. by adjusting the width and/or doping of the traces. In particular, the first electric conductive trace and the second electric conductive trace may be electrically connected by a via. The use of poly-silicon may be an efficient way that during operation, i.e. at temperatures elevated compared to room or test temperatures, the exponentially increasing leakage current through the semiconductor device, e.g. diode or transistor, dominates so that the small additional leakage current flowing through the poly-silicon may be negligible. Thus, it may be possible that the function of the semiconductor device is not under threat even in case that the detection wiring comes into contact with a solder layer later during operation of the semiconductor device (since the resulting leakage current through the detection wiring is small compared to the diode leakage current).

Poly-silicon may be a suitable material for the second trace of the detection airing, since it exhibits only a relatively small temperature dependence of the resistance. In general every material, exhibiting a small temperature dependence of resistance, may be a suitable material for the second electrically conductive trace. A potential upper limit for the temperature dependence of resistance may be about $50 \cdot 10^{-3}/K$ for the absolute value. That is, in case of a semiconductor, typically having a negative temperature coefficient of resistance, the limit may be $-50 \cdot 10^{-3}/K$, i.e. the temperature coefficient of resistance may be $-50 \cdot 10^{-3}/K$ or higher, e.g. in the range of $-1 \cdot 10^{-3}/K$ to $-15 \cdot 10^{-3}/K$, particular about $-2 \cdot 10^{-3}/K$. Alternatively, the temperature dependence of resistance for the second electrically conductive trace may be matched with the temperature dependence of resistance of the main current path or operation in that sense that it ensures that the resistance through the second electrically conductive trace increases with rising temperature compared to the resistance of the main current path.

According to an exemplary embodiment of the semiconductor device the substrate comprises silicon and a contact formed by portions of the second electric conductive trace and the silicon of the substrate.

Thus, a contact or conductive path between poly-silicon and silicon (of the substrate) may be formed in or on the substrate, forming a portion or part of a detection circuitry. However, it should be noted that the contact may be broken or intercepted by a thin isolating layer, e.g. silicon oxide, which cause that a leakage current through the contact only occurs in case a voltage is applied which is above a given or certain threshold. Such a threshold voltage may be applied during a testing process of the semiconductor device and may correspond to a break down voltage. For example, the threshold may be in the range of 2 V to 50 V, in particular in the range of 5 V to 25 V, e.g. about 10 V. Such a threshold may be produced by an oxide layer of a thickness in the range of 2 micrometer to 50 micrometer, in particular in the range of 4 micrometer to 25 micrometer, e.g. about 7.5 micrometer. A resistance of the contact may be in the range of 100 kΩ to 10 MΩ, in particular, in the range of 500 kΩ to 5 MΩ, e.g. about 1 MΩ.

According to an exemplary embodiment of the semiconductor device the connection path is intercepted by a dielectric layer and wherein the connection path is configured to be activated by breaking the dielectric layer.

In particular, the connection path may be activated by applying a voltage to the dielectric layer which voltage breaks through or ruptures the dielectric layer. Thus, a high resistance connection may be formed by the break through. For example, the dielectric layer may be ruptured during a test in which a voltage is applied to the dielectric layer or the connection path exceeding a predetermined threshold. The dielectric layer may be, for example a thin gate oxide layer (e.g. silicon dioxide), a silicon nitride layer, or made of any other suitable dielectric material used in the semiconductor field. It should be noted that the thickness and thus the break through resistance may depend on or set according to the application and/or process flow. Suitable activation voltages or breakthrough voltages may be in the range of 4 V to 40 V, preferably in the range of 5 V to 25 V, e.g. in the range of 6 V to 12 V. In case a voltage above such a breakthrough voltage e.g. 18 V (in case of a breakthrough voltage of 6 V to 12 V) is applied the dielectric layer becomes electrical conductive so that a possible leakage current can be detected.

According to an exemplary embodiment the semiconductor device further comprises a detection circuitry configured to detect a leakage current flowing through the detection wiring.

In particular, the detection circuitry may be formed in the substrate of the semiconductor device chip or may be even formed external to the substrate. For example, the detection circuitry may form an active region, i.e. may be formed by active semiconductor elements or components. For example, the detection circuitry may be directly electrically connected to the detection wiring. Alternatively or additionally the detection circuitry may be (initially) electrically separated by an insulating element or layer. For example, an oxide layer (gate oxide) may be formed between the detection circuitry and the detection wiring (initially), which may be broken or a breakdown may occur during a testing cycle or process so that the insulating layer break down and a current flows.

According to an exemplary embodiment of the semiconductor device the semiconductor device is one selected out of the group consisting of switching element, diode, transistor, MOSFET, IGBT, and capacitor.

In particular, the devices may be power devices, i.e. devices configured to withstand voltages above 10 or 20 Volt and/or currents above 10 ampere. For example, the semiconductor device may be a press-fit diode as often used in the field of rectifier for the automotive sector, for example. In particular, the switching element may be formed by a semiconductor circuit serving as the switching element and including a transistor and/or diode and optionally additional elements (e.g. temperature sensors), for example.

According to an exemplary embodiment of the semiconductor device the connection path has an electrical resistance between 10 kΩ to 100 MΩ.

In particular, the connection path may have an electrical resistance between 100 kΩ and 10 MΩ, e.g. about 1 MΩ. All the resistance values may be measured in a temperature range between 100° C. and 200° C. corresponding to typical operation temperatures.

In the following exemplary embodiments of the semiconductor device arrangement are described. However, the features and elements described with respect to these embodiments can be combined with exemplary embodiments of the semiconductor device, and the methods of manufacturing a semiconductor device.

According to an exemplary embodiment of the semiconductor device arrangement the carrier comprises an electrically conductive material.

The use of an electrically conductive material for the carrier, e.g. a sheathing or housing or a planar carrier, may be in particular advantageous to provide an electrical contact to a voltage level or to ground.

According to an exemplary embodiment of the semiconductor device arrangement the electrically conductive material is a metal.

In particular, the metal may be copper, aluminum or the like. Alternatively, the electrically conductive material may be a semiconductor material. A metal may be in particular advantageous, since a metal may provide for a hard or firm outer casing or housing so that a press-fit of the arrangement may be possible without deforming the sheathing or housing.

According to an exemplary embodiment the semiconductor device arrangement further comprises a head wire electrically connected to the semiconductor device by a further solder layer.

According to an exemplary embodiment the semiconductor device arrangement further comprises a molding compound forming an encapsulation of the semiconductor device.

In the following specific embodiments of the semiconductor device, the semiconductor device arrangement and the methods of manufacturing a semiconductor device will be described in more detail with respect to the figures.

FIG. 1 schematically illustrates a cross sectional view of a semiconductor device according to an exemplary embodiment. In particular, FIG. 1 shows a power diode 100 comprising a substrate 101 made of silicon and having a metal base 102, which may act as a contact layer or may even be a solder layer. However, it should be noted that the semiconductor device may be a transistor, like a MOSFET or an IGBT. Furthermore, in the center region of the substrate a p-doped region 103 is formed which forms a diode together with the substrate. Of course it may be as well possible to form an n-doped central region. On top of the doped region 103 a metallization layer 104 is formed. Surrounding the doped region 103 and the metallization layer 104 a boundary region 105 is present at the substrate. On this boundary region 105 a detection wiring 106 is formed by a metal trace or path which surrounds the center region.

As can be seen in FIG. 1 no conductive path is formed between the center region or active region (formed by the doped region 103 and the metallization layer 104) and the detection wiring 106. That is, the area between the active region and the detection wiring is free of a metallization layer or path. However, the detection wiring is in a direct (high resistance) electrical contact, that is a conductive path having a resistance between 10 kΩ and 100 MΩ is formed in the semiconductor device. For example, the resistance value may be 1 MΩ at room temperature (25° C.). Assuming a temperature coefficient of resistance of about $-2 \cdot 10^{-3}$/K the resistance may decrease to about 800 kΩ at an operation temperature of 125° C., i.e. a decrease of 20% of the resistance, which will correspond to an increase of a leakage current through the detection wiring of 25% from 1 microampere to 1.25 microampere (when 1 V is applied to the detection structure). At the same time the current through the diode may increase by a factor of about 100, so that the leakage current through the detection wiring may be measurable at room temperature but irrelevant at operation temperature, when compared to the current flowing through the diode.

FIGS. 2A to 2C schematically illustrate top views of a semiconductor device according to an exemplary embodiment. In particular, FIG. 2A schematically shows the power diode 200 comprising a substrate 201 having a center region on which a metallization 204 (forming a solderable front side) is formed and a boundary region on/in which a detection wiring 206 is formed.

FIG. 2B schematically illustrate a detail of the power diode 200 of FIG. 2A. In particular, FIG. 2B shows a detail of a corner of the diode 200. Beside the metallization layer 204 the detection wiring can be clearly seen. Also it can be seen that no metallization (no conductive path) is formed or present between the metallization layer 204 and the detection wiring. The detection wiring comprises a first layer or first conductive path 206 which is formed on top of the substrate 201 and a second conductive trace or path 212 which is formed below the first conductive trace 206 in the substrate. Preferably, the first electrically conductive path 206 comprises or consists of copper, while the second electrically conductive path 212 if formed by a semiconductor, e.g. poly-silicon. In addition, a first contact 213 is formed between the first electrically conductive path 206 and the second electrically conductive path 212 and a second contact 214 is formed between the second electrically conductive path 212 and the substrate 201. The second electrically conductive path 212 may have a width of about 3 to 5 micrometer, for example, in case of a substrate of 5×5 millimeter. A suitable dimension of the contacts may be in the range of 10×10 micrometer. FIG. 2C schematically illustrate a greater detail of the power diode 200 of FIG. 2C.

FIG. 3A schematically illustrate a cross sectional view of a semiconductor device arrangement 300 according to an exemplary embodiment. In particular, FIG. 3 shows a power diode arrangement 300 comprising a sheathing or housing 301, preferably made of a metal like copper. In the sheathing 301 a first solder layer or solder plate 302 is placed on which a power diode 303 or power diode chip is placed which comprises a detection wiring 306 and on top of which a further solder layer or solder plate 304 is placed. For contacting the power diode 303 a head wire 305 is formed. In order to manufacture or build the arrangement the elements or components, shown separately in FIG. 3, are soldered to each other by using the solder layers 302 and 304. It should be noted that the arrangement depicted in FIG. 3A shows the detecting wiring arranged on the side of the head wire (upper side in FIG. 3A). This arrangement is preferred for a diode 303 having the polarity as depicted in FIG. 1, (having a p-doped central region). In case of the opposite polarity of the diode (having an n-doped central region) the detection wiring may be arranged of course on the other side of the diode, i.e. on the lower side in FIG. 3A.

Figure 3B:
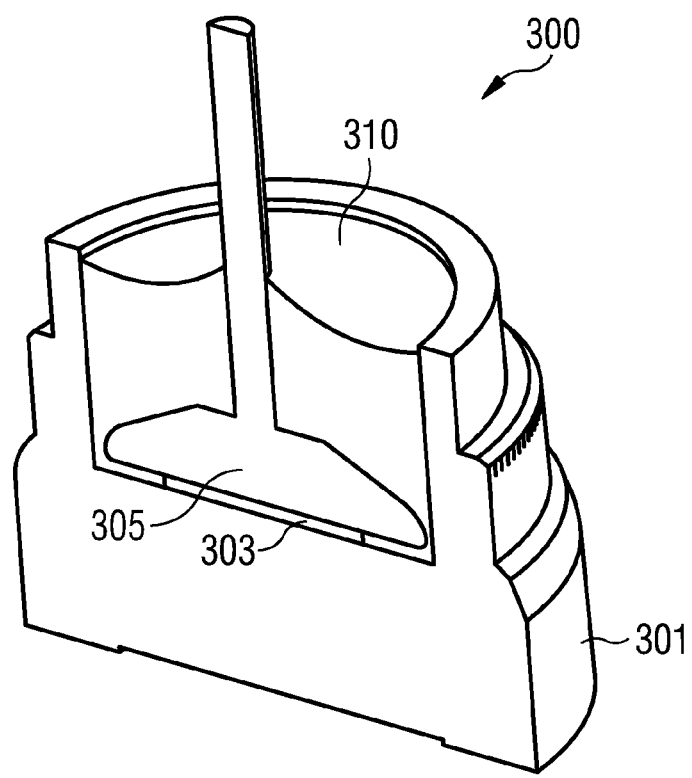

FIG. 3B schematically illustrate a perspective view of the power diode arrangement of FIG. 3A after a soldering step. In addition, a molding compound 310 is shown schematically in FIG. 3B encapsulating the power diode.

Figure 4A:
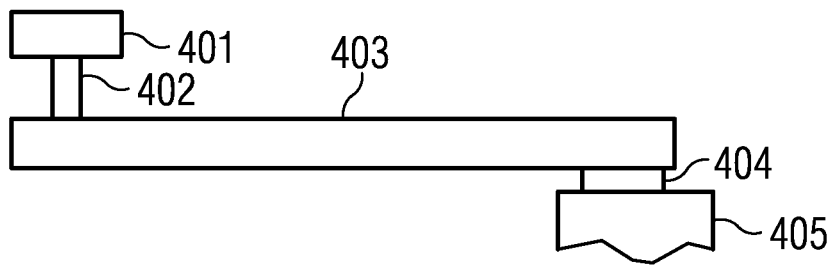
FIGS. 4A and 4B schematically illustrate a detection circuit.
Figure 4B:
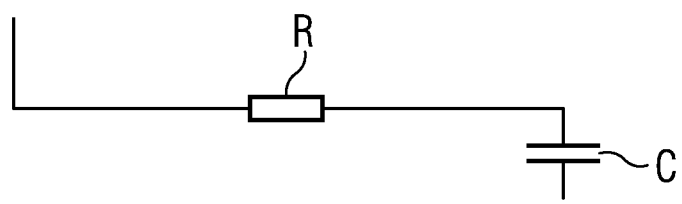

FIGS. 4A and 4B schematically illustrate a detection circuit. In particular, FIG. 4A shows a first electrically conductive path 401 (e.g. a metal line) contacted by a via 402 to a second electrically conductive path 403 (e.g. a poly-silicon path). Both electrically conductive paths form a detection wiring. The second electrically conductive path 403 detection wiring 401 is in turn contacted to an active or detection circuitry 405, e.g. across an oxide 404.

FIG. 4B schematically show an equivalent circuit of the detection circuit of FIG. 4A. In principle, the second electrically conductive path 403 forms a resistance R, while the oxide 404 forms a capacitance C. Together the both components (R/C) form an RC circuit having a time constant τ. Preferably, a test time t or time of a testing process should be great compared to the time constant τ so that the isolation formed by the oxide 404 breaks down.

While the oxide layer (which forms a dielectric layer of a capacitance) initially forms an interception of the connection path, the oxide layer may break through and a high resistance connection path may be formed or activated during a high voltage test. In particular, the dielectric layer of the capacitance is broken or ruptured and thus the connection path becomes conductive (still having a relatively high electric resistance). The breakthrough voltage depends on the thickness of the oxide layer and may be (depending on the manufacturing process) in the range of 6 V to 12 V, for example. In this case the connection path may become electrically conductive during an electrical test during which a voltage of 18 V is applied and thus a leakage current can be detected.

Figure 5:
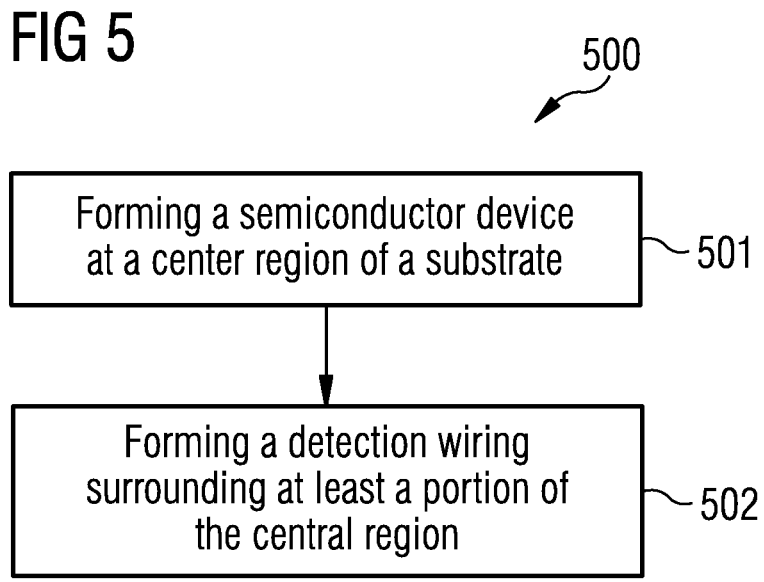
FIG. 5 shows a flowchart of a method of manufacturing a semiconductor device.

FIG. 5 shows a flowchart of a method of manufacturing a semiconductor device. In particular, the method 500 comprises forming a semiconductor device at center region of a substrate (501); and further comprises a forming of a detection wiring (502) surrounding at least a portion of the central region of the substrate, by depositing an electrically conductive trace on the substrate in a boundary region surrounding the center region. After forming the semiconductor device the semiconductor device may be placed on a solder plate arranged in a cavity or recess of a sheathing and on top of the semiconductor device (die) a further solder plate and/or a head wire may be placed. Then the assembly may be soldered and an optional molding compound may be molded around the assembled component.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device, the semiconductor device comprising:
    a semiconductor device chip formed at a substrate, wherein the semiconductor device chip comprises an active region formed at a center of the substrate and a boundary region free of active components of the semiconductor device chip; and
    a detection wiring arranged in the boundary region of the substrate and at least partially surrounding the active region;
    wherein the detection wiring and the semiconductor device chip are electrically isolated from each other;
    wherein the detection wiring and the substrate are electrically connected with each other via a connection path having a high electrical resistance;
    wherein the detection wiring comprises a first electric conductive trace and a second electric conductive trace;
    wherein the first electric conductive trace is arranged above the second electric conductive trace; and
    wherein the first electric conductive trace comprises a metal and the second electric conductive trace comprises poly-silicon.

2. The semiconductor device according to claim 1, wherein the detection wiring surrounds the active region formed in the center region of the substrate.

3. The semiconductor device according to claim 1, wherein the detection wiring is formed so that a leakage current flowing through the detection wiring is small compared to a diode leakage current at operation temperature of the semiconductor device.

4. The semiconductor device according to claim 1, wherein a material of the second electric conductive trace has a lower temperature dependence of resistance than a temperature dependence of resistance of the semiconductor device.

5. The semiconductor device according to claim 1, wherein the substrate comprises silicon and a contact formed by portions of the second electric conductive trace and the silicon of the substrate.

6. The semiconductor device according to claim 1, wherein the connection path is intercepted by a dielectric layer and wherein the connection path is configured to be activated by breaking the dielectric layer.

7. The semiconductor device according to claim 1, further comprising a detection circuitry configured to detect a leakage current flowing through the detection wiring.

8. The semiconductor device according to claim 1, wherein the semiconductor device is one selected out of the group consisting of:
 switching element,
 diode,
 transistor,
 MOSFET,
 IGBT, and
 capacitor.

9. The semiconductor device according to claim 1, wherein the connection path has an electrical resistance between 10 kΩ to 100 MΩ.

10. A semiconductor device arrangement, comprising:
 a semiconductor device according to claim 1, and
 a carrier comprising a base,
 wherein the semiconductor device is attached to the base of the carrier by a solder layer.

11. The semiconductor device arrangement according to claim 10, wherein the carrier comprises an electrically conductive material.

12. The semiconductor device arrangement according to claim 11, wherein the electrically conductive material is metal.

13. The semiconductor device arrangement according to claim 10, further comprising a head wire electrically connected to the semiconductor device by a further solder layer.

14. The semiconductor device arrangement according to claim 10, further comprising a molding compound forming an encapsulation of the semiconductor device.

* * * * *

UNITED STATES PATENT AND TRADEMARK OFFICE
CERTIFICATE OF CORRECTION

PATENT NO. : 9,698,107 B2  
APPLICATION NO. : 14/953302  
DATED : July 4, 2017  
INVENTOR(S) : Dietrich Bonart and Alfred Goerlach Page 1 of 1

It is certified that error appears in the above-identified patent and that said Letters Patent is hereby corrected as shown below:

On the Title Page

Item [73], insert:
--Infineon Technologies AG of Neubiberg, Germany-- and --Robert Bosch GmbH of Stuttgart-Feuerbach, Germany--.

Signed and Sealed this  
Sixth Day of March, 2018

Andrei Iancu  
*Director of the United States Patent and Trademark Office*